(12) United States Patent
Yanagigawa et al.

(10) Patent No.: US 7,733,133 B2
(45) Date of Patent: Jun. 8, 2010

(54) POWER SWITCH CIRCUIT HAVING VARIABLE RESISTOR COUPLED BETWEEN INPUT TERMINAL AND OUTPUT TRANSISTOR AND CHANGING ITS RESISTANCE BASED ON STATE OF OUTPUT TRANSISTOR

(75) Inventors: Hiroshi Yanagigawa, Shiga (JP); Masaki Kojima, Shiga (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/314,688

(22) Filed: Dec. 15, 2008

(65) Prior Publication Data

US 2009/0179685 A1    Jul. 16, 2009

(30) Foreign Application Priority Data

Jan. 10, 2008    (JP) .............................. 2008-003437

(51) Int. Cl.
*H03K 3/00* (2006.01)

(52) U.S. Cl. ....................... 327/108; 327/312; 327/318; 327/323

(58) Field of Classification Search ................. 327/108, 327/312, 318, 323
See application file for complete search history.

(56) References Cited

U.S. PATENT DOCUMENTS 5,497,285 A * 3/1996 Nadd .......................... 361/103
5,500,619 A * 3/1996 Miyasaka ..................... 327/427
6,054,890 A * 4/2000 Giacomo ..................... 327/375
6,288,596 B1 * 9/2001 Johansson et al. ........... 327/512
6,903,597 B2 * 6/2005 Tai .............................. 327/434
7,449,935 B2 * 11/2008 Scollo et al. ................. 327/374
7,570,085 B2 * 8/2009 Ishikawa et al. ............ 327/108

FOREIGN PATENT DOCUMENTS

| JP | 5-198801 | * | 8/1993 |
| JP | 6-244414 | * | 9/1994 |
| JP | 2005-93763 | * | 4/2005 |

* cited by examiner

*Primary Examiner*—Kenneth B. Wells
(74) *Attorney, Agent, or Firm*—McGinn IP Law Group, PLLC

(57) ABSTRACT

A power switch circuit includes an output transistor which is connected between a first power supply terminal and an output terminal, and drives a load, an abnormality detecting circuit which detects an abnormal state of the output transistor, a resistance element which generates a resistance component by a diffusion layer formed on a well region, and is provided between an input terminal and a control terminal of the output transistor, and a well potential switching circuit which switches a voltage to be supplied to the well region between a voltage of the output terminal and a voltage of a second power supply terminal based on a detection result by the abnormality detecting circuit.

10 Claims, 5 Drawing Sheets

POWER SWITCH CIRCUIT HAVING VARIABLE RESISTOR COUPLED BETWEEN INPUT TERMINAL AND OUTPUT TRANSISTOR AND CHANGING ITS RESISTANCE BASED ON STATE OF OUTPUT TRANSISTOR

BACKGROUND OF THE INVENTION

1. Field of the Invention

The present invention relates to a power switch circuit, and particularly relates to a power switch circuit having a protection function of protecting an output transistor when an abnormal state occurs in the power switch circuit.

2. Description of Related Art

As the switch circuits which handle large electric power, many power switch circuits using power MOS transistors are used. Such a power switch circuit is sometimes loaded with the protective function of protecting the circuit by detecting the overheat state and overcurrent state of a semiconductor device. The protective function can be realized by, for example, a gate resistance which is provided between a gate terminal of a power MOS transistor and an input terminal which inputs therein a drive signal for the power MOS transistor, and a MOS switch for a protection circuit, which is provided between the gate terminal and the source terminal of the power MOS transistor. In the power switch circuit, when the power MOS transistor is in an overheat state, a current is passed to the gate resistance by turning on the MOS switch for the protection circuit, and a voltage between the gate and source of the power MOS transistor is decreased to turn off the power MOS transistor, whereby element breakdown due to overheating is prevented.

As the gate resistance for realizing the above described protective function, the resistor having a fixed resistance value is generally used. However, when the resistance value of the gate resistance is set to be small, there is the fear that a current continues to be passed to the gate of the power MOS transistor from the input terminal at the time of an overheat state to break the device. Meanwhile, when the resistance value of the gate resistance is set to be large, there arises the problem that the switching speed of the power MOS transistor becomes low due to voltage drop at the time of the normal state. An art of avoiding the problem when the resistance value of the gate resistance is fixed is disclosed in Patent Document 1.

FIG. 7 shows a block diagram of a semiconductor device (hereinafter, called a power switch circuit 100) described in Patent Document 1. As shown in FIG. 7, the power switch circuit 100 has a variable resistor 111, an abnormality detecting circuit 112, a power switch element (called a power MOS transistor) 113, and a gate cutoff MOS 114. Further, in the power switch circuit 100, a load is connected between an output terminal OUT and a power supply 102. The variable resistor 111 in Patent Document 1 is an element in which a MOS structure is formed by polysilicon and an N-type diffused resistor.

A drive circuit (not illustrated) is connected to an input terminal IN of the power switch circuit 100, and supplies a high signal to the input terminal IN of the power switch circuit 100 at the time of a normal operation. The high signal is supplied to a gate terminal of the power MOS transistor 113 through the N-type diffused resistor connected to aluminum wiring via a contact. The variable resistor 111 connects the input terminal IN and the gate of the power MOS transistor 113 via the N-type diffused resistor which is formed at a lower portion of the polysilicon, at the time of the normal operation.

Meanwhile, at the time of an abnormal state, the N-type diffused resistor formed at the lower portion of the polysilicon is in a cutoff state, and therefore, the variable resistor 111 connects the input terminal IN and the gate of the power MOS transistor 113 via the N-type diffused resistor formed in a region around the polysilicon. More specifically, the variable resistor 111 connects the input terminal IN and the gate of the power MOS transistor 113 with a low resistance at the time of a normal operation, and connects the input terminal IN and the gate of the power MOS transistor 113 with a high resistance at the time of an abnormal state.

Patent Document 2 discloses the one in which the variable resistor 111 in Patent Document 1 is configured by using a P-channel MOSFET. Further, Patent Document 3 discloses the one in which the variable resistor 111 in Patent Document 1 is configured by using a J-FET. The output of the abnormally detection circuit shown in Patent Document 1 to 3 each is applied to the control gate of FET constituting the variable resistor.

[Patent Document 1] Japanese Patent Application Laid-Open No. 2005-93763

[Patent Document 2] Japanese Patent Application Laid-Open No. 6-244414

[Patent Document 3] Japanese Patent Application Laid-Open No. 5-198801

SUMMARY

However, in the power switch circuit 100 disclosed in each of Patent Documents 1 to 3, the element having the MOS structure is used as the variable resistor 111, and therefore, due to the existence of the gate voltage dependency of the element configuring the variable resistor 111, the resistance value varies in accordance with the voltage of the input terminal IN. When such variation of the resistance value occurs, it becomes difficult to give a drive signal by a constant current to the input terminal and perform waveform shaping of the gate voltage of the power MOS transistor 113 with high accuracy, in order to reduce noise which occurs to the power MOS transistor 113.

A power switch circuit according to one exemplary aspect of the present invention has an output transistor which is connected between a first power supply terminal and an output terminal, to drive a load;

an abnormality detecting circuit which detects an abnormal state of the output transistor;

a resistance element which generates a resistance component by a diffusion layer formed on a well region, and is provided between an input terminal and a control terminal of said output transistor; and a well potential switching circuit which selectively supplies said well region with a voltage of said output terminal or a voltage of a second power supply terminal, based on a detection result by the abnormality detecting circuit.

According to the power switch circuit according to the exemplary aspect of the present invention, a voltage of the output terminal is applied to the well region of the resistance element at the time of a normal operation, the variation of the potential difference of the well region and the diffusion layer is suppressed, and variation of the resistance value can be suppressed. Meanwhile, at the time of an abnormal state, the voltage (for example, a ground voltage) of the second power supply terminal is applied to the well region, and the potential difference of the well region and the diffusion layer is made large, whereby a high resistance value can be realized.

According to the power switch circuit according to the exemplary aspect of the present invention, variation of the resistance value of the gate resistance is suppressed at the time of a normal state, while proper circuit protection is realized by realizing high resistance at the time of an abnormal state, and control of the gate voltage with high accuracy can be performed.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
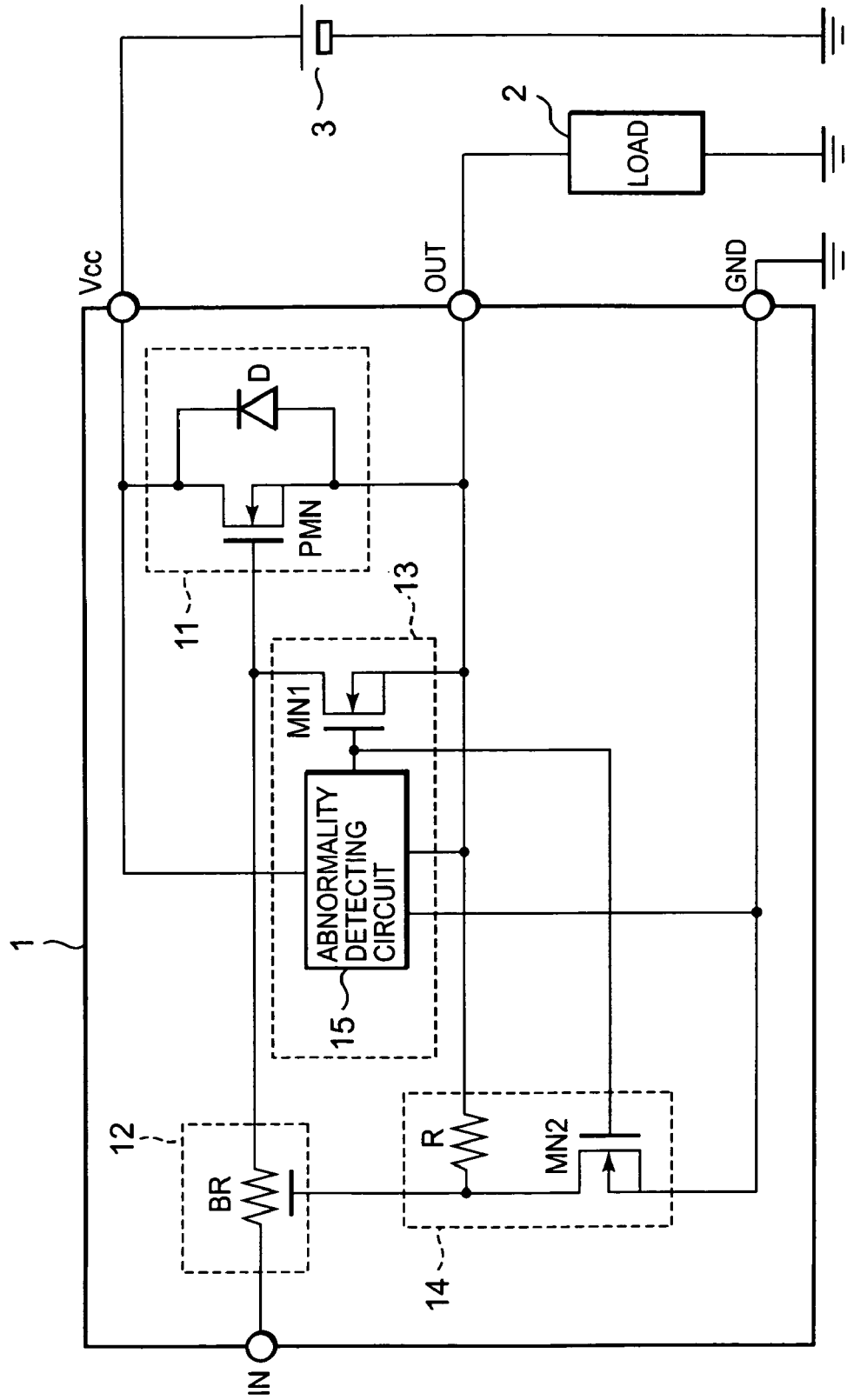
FIG. 1 is a block diagram of a power switch circuit according to a first exemplary embodiment 1.

FIG. 1 shows a block diagram of a power switch circuit 1 according to a first exemplary embodiment. As shown in FIG. 1, the power switch circuit 1 has an output transistor 11, a resistance element 12, a protection circuit 13 and a well potential switching circuit 14. Further, the power switch circuit 1 has an input terminal IN, an output terminal OUT, a first power supply terminal (for example, a power supply terminal Vcc) and a second power supply terminal (for example, a ground terminal GND). A load 2 is connected to the output terminal OUT, a power supply voltage is supplied to the power supply terminal Vcc from a power supply 3, and a ground voltage is supplied to the ground terminal GND. Further, in the following description, each of the elements of the power switch circuit 1 is described on the assumption that its circuit is formed on the N-type semiconductor substrate, as one example.

The output transistor 11 has a power MOS transistor PMN and a parasitic diode D of the power MOS transistor PMN. In the exemplary embodiment, as the power MOS transistor PMN, an N-channel MOS transistor is used. In the power MOS transistor PMN, a source terminal is connected to the output terminal OUT, a drain terminal is connected to the power supply terminal Vcc, and a control terminal (for example, a gate terminal) is connected to the input terminal IN via the resistance element 12. A control circuit (not illustrated) is connected to the input terminal IN, and the control circuit gives a drive signal of the power MOS transistor PMN to the input terminal. In the parasitic diode D, a cathode is connected to the source terminal, and an anode is connected to the drain terminal.

The resistance element 12 functions as a gate resistance of the power MOS transistor PMN. In the present embodiment, a diffused resistor BR is used as the resistance element 12. A voltage which is supplied from the well potential switching circuit 14 is input into a well terminal of the diffused resistor BR. The details of the diffused resistor BR will be described later.

The protection circuit 13 is a circuit which performs protection of the output transistor 11. The protection circuit 13 has an abnormality detecting circuit 15 and a gate cutoff transistor MN1. The abnormality detecting circuit 15 operates based on the voltage of each of the terminals of the ground terminal GND, the power supply terminal Vcc and the output terminal OUT. The abnormality detecting circuit 15 detects abnormality (for example, an overheat state and an overcurrent state) which occurs in the output transistor 11, for example. The abnormality detecting circuit 15 outputs a detection result signal (for example, a signal which is at a high level at the time of detection of an abnormality, and is at a low level at the time of non-detection of an abnormality) which provides notification of detection of an abnormality when the abnormality detecting circuit 15 detects the abnormality.

In the gate cutoff transistor MN1, a drain terminal is connected to the gate terminal of the power MOS transistor PMN, a source terminal is connected to the output terminal OUT, and the detection result of the abnormality detecting circuit 15 is input into a gate terminal. In the present embodiment, an N-channel MOS transistor is used as the gate cutoff transistor MN1.

The well potential switching circuit 14 switches a voltage to be supplied to the well terminal of the diffused resistor BR between the voltage of the output terminal OUT and the voltage of the ground terminal GND based on the detection result by the abnormality detecting circuit 15. More specifically, the well potential switching circuit 14 supplies the voltage of the output terminal OUT to the well terminal of the diffused resistor BR when the abnormality detecting circuit 15 outputs the detection result of non-detection of an abnormality, and supplies the voltage of the ground terminal GND to the well terminal of the diffused resistor BR when the abnormality detecting circuit 15 outputs the detection result of detection of an abnormality. The well potential switching circuit 14 has a resistor R and a switch transistor MN2. The resistor R is connected between the output terminal OUT and the well terminal of the diffused resistor BR. In the switch transistor MN2, a source terminal is connected to the ground terminal GND, a drain is connected to the well terminal of the diffused resistor BR, and the detection result of the abnormality detecting circuit 15 is input into the gate terminal. In the present embodiment, as the switch transistor MN2, an N-channel MOS transistor is used.

Figure 2:
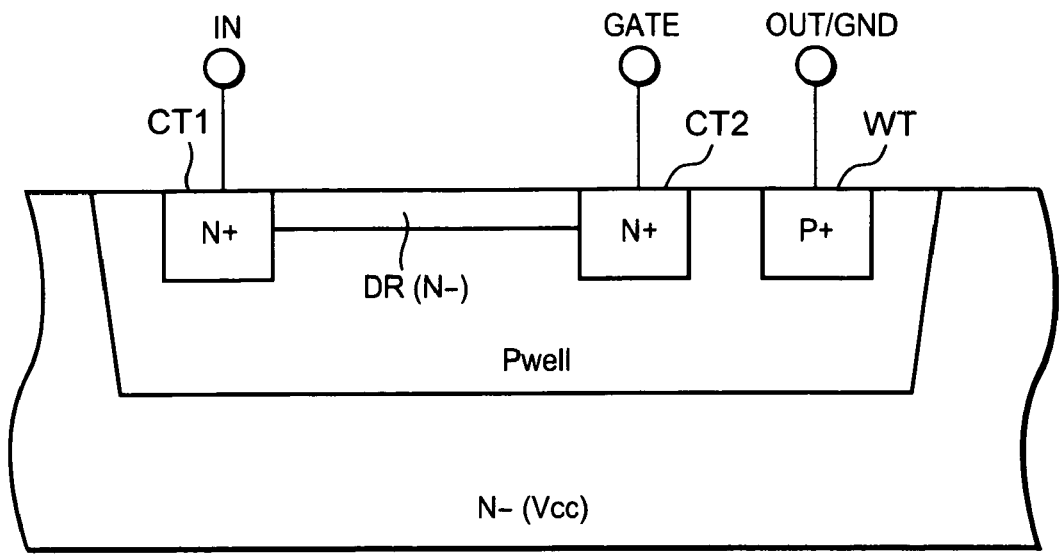
FIG. 2 is a sectional view of a diffused resistor according to the first exemplary embodiment.

Here, a sectional view of the diffused resistor BR is shown in FIG. 2, and the diffused resistor BR will be described. In the diffused resistor BR, a P-well region Pwell which is formed by a second conductive type semiconductor (for example, a P-type semiconductor) is formed on an upper layer of a semiconductor substrate which is formed by a first conductive type semiconductor (for example, an N-type semiconductor) with a low impurity concentration. Subsequently, connection terminals CT1 and CT2 which are formed by a first conductive type semiconductor (for example, an N+ type semiconductor) with a high impurity concentration are formed on an upper layer of the P-well region. Subsequently, a resistance region DR which generates a resistance component is formed by an N-type semiconductor to connect the connection terminals CT1 and CT2. Further, a well terminal WT which supplies a voltage to the P-well region Pwell is formed in the P-well region Pwell by the second conductive type semiconductor (for example, a P+ type semiconductor) with a high impurity concentration. The connection terminal CT1 is connected to the input terminal IN, the connection terminal CT2 is connected to a gate terminal GATE of the power MOS transistor PMN, and the well terminal WT is connected to the output terminal OUT or the ground terminal GND in accordance with the state of the well potential switching circuit 14.

In the diffused resistor BR, variation occurs to the resistance value in accordance with the potential difference of the resistance region DR and the P-well region Pwell. When the potential difference becomes a predetermined value or more, the diffusion resistor BR is pinched off, and the resistance value abruptly becomes high (for example, the resistance value becomes substantially infinite).

Figure 3:
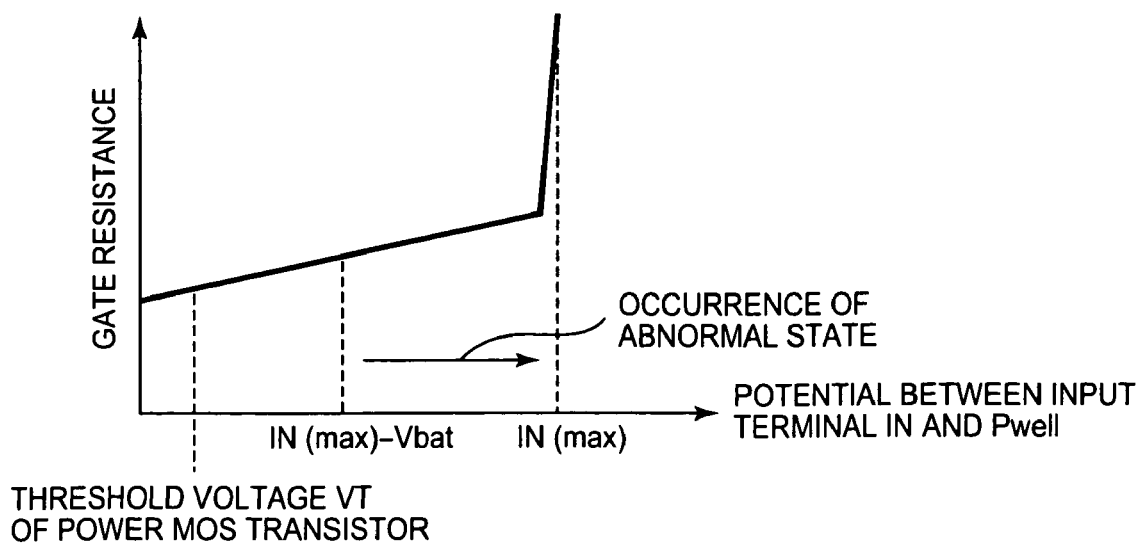
FIG. 3 is a graph showing a voltage dependence characteristic of a resistance value of the diffused resistor according to the first exemplary embodiment.

FIG. 3 shows a graph showing the voltage dependence characteristic of the resistance value of the diffused resistor BR.

Subsequently, an operation of the power switch circuit 1 will be described. On description of the operation, reference is made to the graph of the voltage dependence characteristic of the diffused resistor BR of FIG. 3. The power supply switch circuit 1 brings the power MOS transistor PMN into an ON state by raising the voltage level of the drive signal which is input into the input terminal IN in the normal operation. At this time, in the abnormality detecting circuit 15, an abnormality is not detected, and therefore, the detection result is non-detection of an abnormality, and the gate cutoff transistor MN1 and the switch transistor MN2 are brought into an OFF state. Therefore, the drive signal from the input terminal IN is input into the gate terminal of the power MOS transistor PMN via the diffused resistor BR. Further, the voltage of the output terminal OUT is input into the well terminal WT of the diffused resistor BR. Subsequently, the voltage of the output terminal OUT gradually rises in accordance with the voltage level of the drive signal. At this time, the potential difference of the resistance region DR and the P-well region Pwell of the diffused resistor BR becomes a difference of the voltage of the input terminal IN and the voltage of the output terminal OUT. Specifically, the potential difference becomes a threshold voltage VT of the power MOS transistor PMN. Thereafter, when the voltage of the output terminal OUT reaches the power supply voltage (hereinafter, called a power supply voltage Vbat) which is output by the power supply 3, the potential difference of the resistance region DR and the P-well region Pwell of the diffused resistor BR becomes a differential voltage of the voltage of the input terminal IN and the power supply voltage Vbat, and gradually becomes large. Until the voltage level of the drive signal reaches the maximum value (IN(max)), the potential difference becomes large.

More specifically, in the power switch circuit 1, in the normal operation, the potential difference of the resistance region DR and the P-well region Pwell of the diffused resistor BR is constant until the voltage of the output terminal OUT reaches the power supply voltage Vbat. Therefore, in this period, the resistance value of the diffused resistor BR is kept constant. Further, after the voltage of the output terminal OUT reaches the power supply voltage Vbat, the resistance value of the diffused resistor BR varies, but in this period, the power MOS transistor PMN is in a sufficient ON state, and therefore, variation of the resistance value of the diffused resistor BR does not have an influence on the output characteristic of the power MOS transistor PMN.

Next, the operation of the power switch circuit 1 when an abnormal operation occurs will be described. In the following description, an example in which an abnormal state occurs in the power MOS transistor PMN when the drive signal is at a high level (voltage which brings the power MOS transistor PMN into an ON state) will be described.

When an abnormal state occurs in the power MOS transistor PMN, the abnormality detecting circuit 15 detects the abnormality, and the detection result becomes the abnormality detection state. Therefore, the gate cutoff transistor MN1 and the switch transistor MN2 are brought into the ON states. Thereby, the gate cutoff transistor MN1 extracts electric charges to the output terminal from the gate terminal of the power MOS transistor PMN, and causes the voltage between the gate and source of the power MOS transistor PMN the to be the threshold voltage or less, and the power MOS transistor PMN is brought into an OFF state. Further, the voltage (for example, the ground voltage) of the ground terminal is supplied to the well terminal WT of the diffused resistor BR via the switch transistor MN2. Therefore, the potential difference of the resistance region DR and the P-well region Pwell of the diffused resistor BR becomes the difference (voltage IN(max)) between the voltage of the input terminal IN (for example, IN(max)) and the ground voltage given by the ground terminal GND. When the potential difference of the resistance region DR and the P-well region Pwell becomes IN(max), the diffused resistor BR pinches off, and the resistance value becomes large to be substantially infinite. Therefore, connection of the gate terminal and the input terminal IN of the power MOS transistor PMN is in a cutoff state. Thereby, the voltage of the gate terminal of the power MOS transistor PMN keeps the OFF state in the period in which the abnormal state occurs. Meanwhile, when the abnormality detecting circuit 15 detects release from the abnormal state, the power switch circuit 1 shifts to the normal operation.

By the above description, the power switch circuit 1 in the present embodiment switches the voltage to be supplied to the P-well region Pwell of the diffused resistor BR by the well potential switching circuit 14 which switches the voltage in the normal operation and the abnormal state. Thereby, the power switch circuit 1 keeps the gate resistance at a low resistance in the normal operation, and can switch the gate resistance to a high resistance in an abnormal state.

Further, the power switch circuit 1 makes the potential of the P-well region Pwell of the diffused resistor BR the voltage of the output terminal OUT of which voltage varies in accordance with the voltage level of the drive signal input into the input terminal IN, and thereby, suppresses variation of the potential difference of the resistance region DR and the P-well region Pwell of the diffused resistor BR, in the normal operation. Thereby, variation of the resistance value of the diffused resistor BR in the normal operation can be suppressed. Especially, in the period until the voltage of the output terminal OUT reaches the power supply voltage Vbat in which the linearity of the drive signal and the voltage of the output terminal OUT is important, the resistance value of the diffused resistor BR is kept constant. More specifically, in this period, the power switch circuit 1 can control the voltage of the gate terminal of the power MOS transistor PMN with high accuracy. Especially when the voltage of the gate terminal of the power MOS transistor PMN is controlled by the current which is input into the input terminal IN, the linearity of the voltage of the gate terminal is improved by keeping the resistance value of the diffused resistor BR constant.

Thus, in the exemplary embodiment of the present invention, by including the output transistor 11 which is connected between the power supply terminal Vcc and the load 2, the protection circuit 13 which protects the output transistor 11, and is configured by the abnormality detecting circuit 15 and the gate cutoff transistor MN1, the resistance element 12 which transmits the drive signal voltage of the output transistor 11 and has the other conductive type region (resistance region DR) which is selectively formed in one conductive type region (P-well region Pwell) as the resistance component, and the well potential switching circuit 14 which supplies to the P-well region Pwell, the potential which changes in accordance with the drive signal voltage when the protection circuit does not operate, and supplies the potential which brings the resistance region DR into a pinch-off state when the protection circuit operates, the resistance element 12 exhibits a substantially constant low resistance, and therefore, waveform shaping at the time of switching-on of the output transistor 11 becomes easy. Meanwhile, when an abnormal state such as overcurrent and overvoltage occurs and the protection circuit 13 operates, the resistance region DR is in the pinch-off state, and transition of the output transistor 11 to the cutoff state becomes very easy.

Second Exemplary Embodiment

Figure 4:
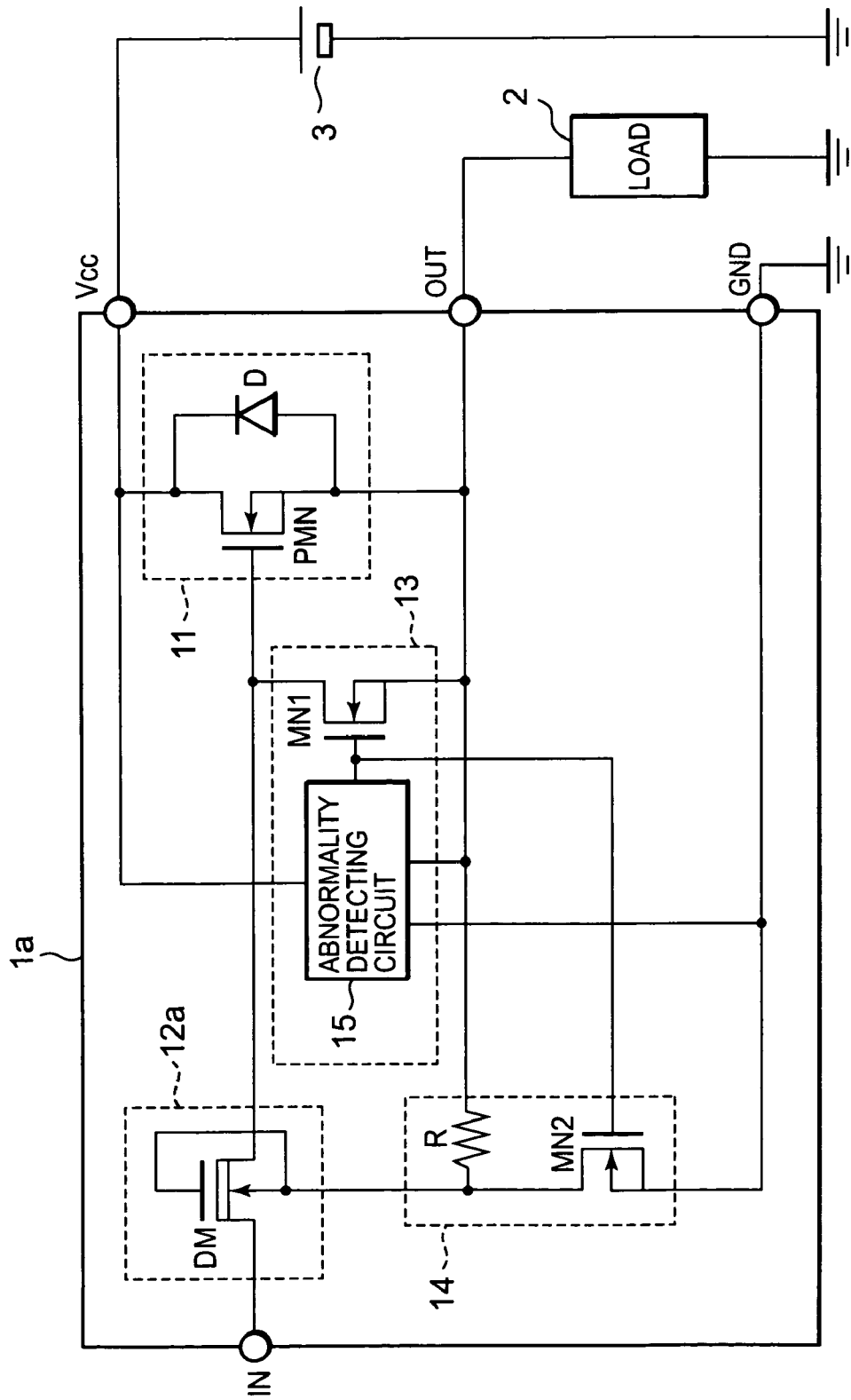
FIG. 4 is a block diagram of a power switch circuit according to a second exemplary embodiment.

FIG. 4 shows a block diagram of a power switch circuit 1a according to a second exemplary embodiment. As shown in FIG. 4, the power switch circuit 1a includes a resistance element 12a in place of the resistance element 12. In the resistance element 12a, a depression type MOS transistor DM is used as a resistance element. In the depression type MOS transistor, one of the source and drain is connected to an input terminal IN, and the other of the source and drain is connected to a gate terminal of a power MOS transistor PMN. Further, in the depression type MOS transistor DM, a gate terminal is connected to a back gate terminal (well terminal WT).

Figure 5:
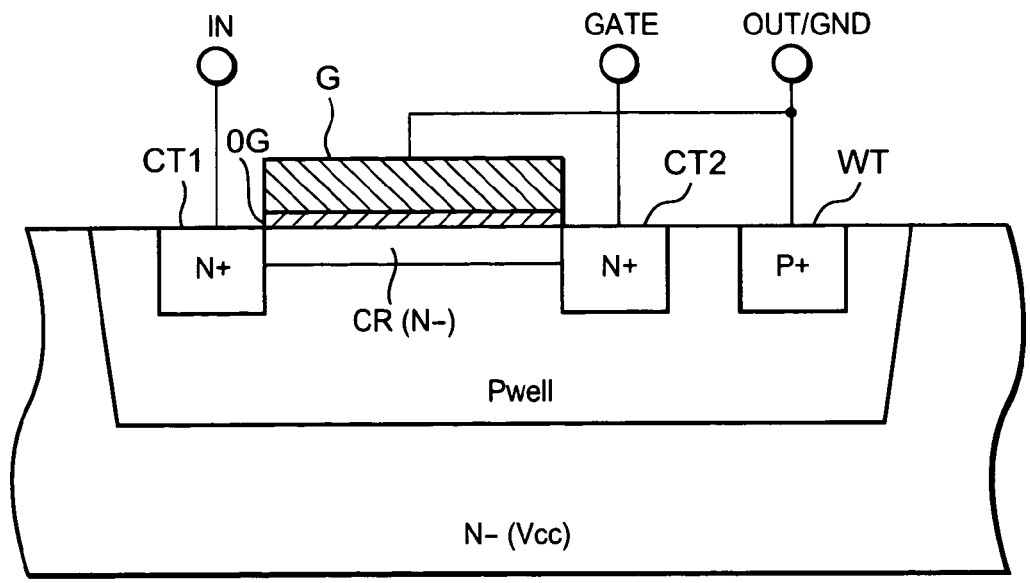
FIG. 5 is a sectional view of a depression type MOS transistor according to the second exemplary embodiment.

Here, FIG. 5 shows a sectional view of the depression type MOS transistor DM. As shown in FIG. 5, in the depression type MOS transistor DM, a P-well region Pwell formed by a P-type semiconductor is formed in the upper layer of a semiconductor substrate formed by an N-type semiconductor. Connection terminals CT1 and CT2 to be a source or a drain which are formed by an N+ type semiconductor are formed in the upper layer of the P-well region. Subsequently, a channel region CR which generates a resistance component is formed by an N-type semiconductor so as to connect the connection terminals CT1 and CT2. Further, a gate electrode G is formed in the upper layer of the channel region CR via a gate oxide film OG. Further, in the P-well region Pwell, a well terminal WT which supplies a voltage to the P-well region Pwell is formed by a P+ type semiconductor. Subsequently, the connection terminal CT1 is connected to the input terminal IN, the connection terminal CT2 is connected to a gate terminal GATE of the power MOS transistor PMN, the gate electrode G is connected to the well terminal WT, and the well terminal WT is connected to the output terminal OUT or the ground terminal GND in accordance with the state of the well potential switching circuit 14.

Figure 6:
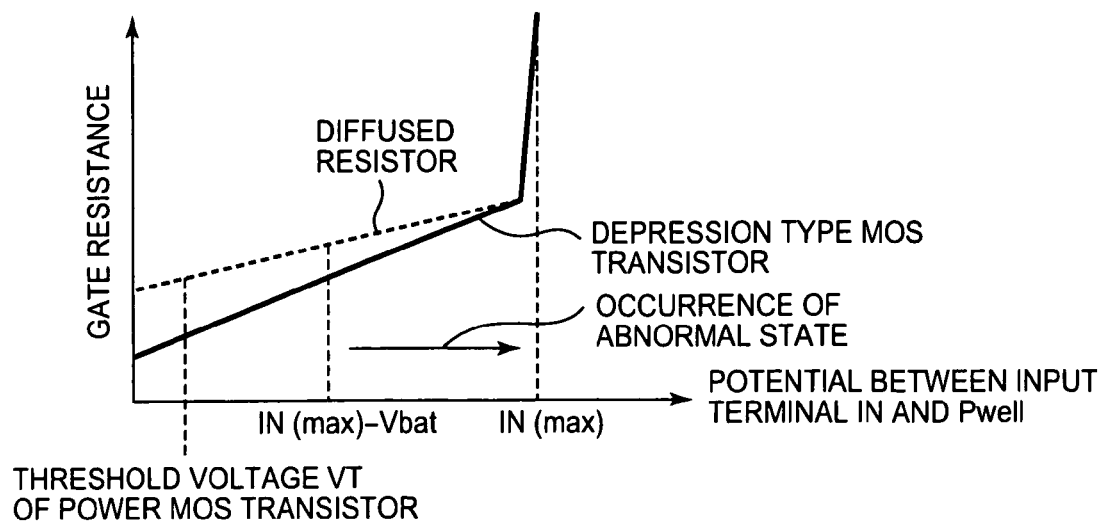
FIG. 6 is a graph showing a voltage dependence characteristic of a resistance value of the depression type MOS transistor according to the second exemplary embodiment.
Figure 7:
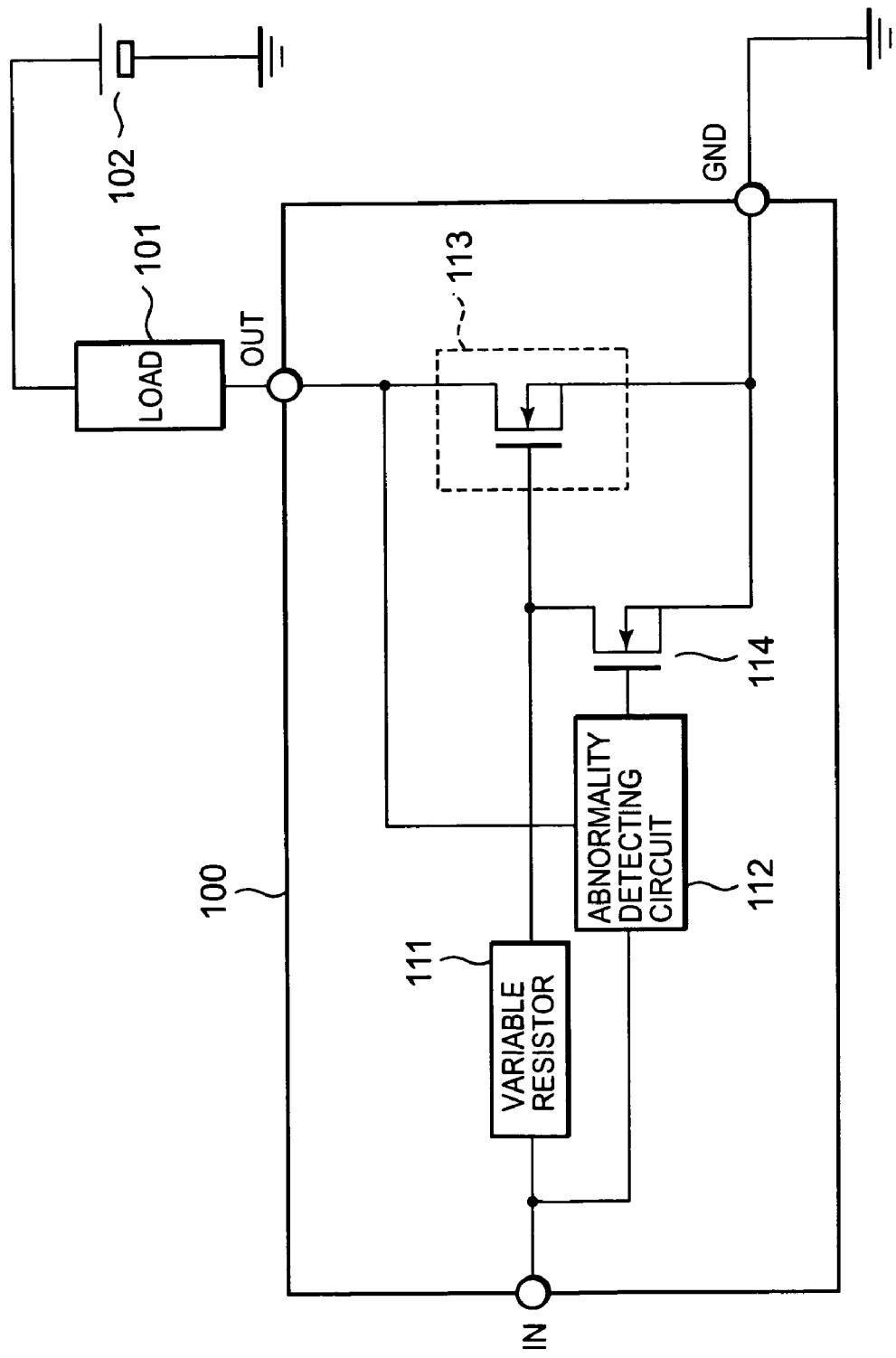
FIG. 7 is a block diagram of a power switch circuit of a related art.

Next, FIG. 6 shows a graph showing the voltage dependence characteristic of the resistance value of the depression type MOS transistor DM. In FIG. 6, the voltage dependence characteristic of the resistance value of the diffused resistor BR is shown by the broken line for reference. As shown in FIG. 6, even with the depression type MOS transistor DM, the resistance value varies based on the potential difference of the channel region CR and the P-well region Pwell, and when the potential difference becomes a predetermined value or more, the depression type MOS transistor DM pinches off, as the diffused resistor BR. However, the depression type MOS transistor DM easily pinches off since a depletion layer also extends from the gate terminal side. Therefore, the depression type MOS transistor DM has a larger rate of change of the resistance than the diffused resistor BR.

Accordingly, when the depression type MOS transistor DM is used, the impurity concentration of the diffusion layer configuring the channel region CR can be made higher as compared with the case of using the diffused resistor BR. As a result of it, there is provided the effect of being capable of making the size of the depression type MOS transistor DM smaller than that of the diffused resistor BR.

From the above description, the power switch circuit 1a can realize control of the gate terminal of the power MOS transistor PMN with high accuracy as in embodiment 1 while making the resistance element smaller than that of the first exemplary embodiment. Further, the power switch circuit 1a can properly perform protection of the circuit in an abnormal state as in the first exemplary embodiment.

The present invention is not limited to the above described embodiment, but can be properly modified within the range without departing from the scope of the invention. For example, in the above described embodiments, the power switch circuit which configures a high side switch is described, but the present invention also can be applied to the case of configuring the power switch circuit as a low side switch which is provided at the ground terminal side of the load.

Further, it is noted that Applicant's intent is to encompass equivalents of all claim elements, even if amended later during prosecution.

What is claimed is:

1. A power switch circuit, comprising:
    an output transistor which is connected between a first power supply terminal and an output terminal, to drive a load;
    an abnormality detecting circuit which detects an abnormal state of said output transistor;
    a resistance element which generates a resistance component by a diffusion layer formed on a well region, and is provided between an input terminal and a control terminal of said output transistor; and
    a well potential switching circuit which selectively supplies said well region with a voltage of said output terminal or a voltage of a second power supply terminal, based on a detection result by said abnormality detecting circuit.

2. The power switch circuit according to claim 1,
    wherein said well potential switching circuit supplies the voltage of said output terminal to said well region when said abnormality detecting circuit detects a state other than the abnormal state, and supplies the voltage of the second power supply terminal to said well region when said abnormality detecting circuit detects the abnormal state.

3. The power switch circuit according to claim 1,
    wherein said resistance element comprises a diffused resistor.

4. The power switch circuit according to claim 1,
    wherein said resistance element comprises a depression type MOS transistor using a channel region as said diffusion layer.

5. The power switch circuit according to claim 1,
    wherein said well potential switching circuit includes:
        a resistor provided between said output terminal and said well region; and
        a switch transistor which is provided between said second power supply terminal and said well region, and supplies the voltage of said second power supply terminal to said well region when said abnormality detecting circuit detects the abnormal state.

6. The power switch circuit according to claim 1,
wherein said abnormality detecting circuit detects an overheat state or an overcurrent state of said output transistor.

7. A power switch circuit, comprising:
an output transistor connected between a power supply terminal and a load;
a protection circuit which protects said output transistor;
a resistance element that transmits a drive signal voltage of said output transistor, and that is provided by a first conductivity type region as a resistance component formed in a second conductivity region; and
a switching circuit which supplies said second conductivity type region, with a potential which changes in accordance with said drive signal voltage when said protection circuit does not operate, and with a potential which brings said first conductivity type region into a pinch-off state when said protection circuit operates.

8. The power switch circuit according to claim 7,
wherein said resistance element includes a diffused resistor using said first conductivity type region as a resistor.

9. The power switch circuit according to claim 7,
wherein said resistance element includes a depression type MOS transistor using a channel region as said first conductivity type region, and a gate of said depression type MOS transistor is connected to said second conductivity type region.

10. A semiconductor device, comprising:
an output transistor coupled between a first power source terminal and an output terminal for driving a load;
a protection circuit including:
  an abnormal detecting circuit, coupled between the first power source terminal and the output terminal, which outputs a control signal; and
  a first switch, coupled between a control gate of the output transistor and the output terminal, including a control gate thereof receiving the control signal;
a diffusion region including a first node coupled to an input terminal and a second node coupled to the control gate of the output transistor, the diffusion region being formed in a well region; and
a switching circuit including:
  a resistor coupled between the well region and the output terminal; and
  a second switch, coupled between the well region and a second power source terminal, including a control gate thereof receiving the control signal.

* * * * *